(12) United States Patent
Macri et al.

(10) Patent No.: US 7,869,525 B2
(45) Date of Patent: Jan. 11, 2011

(54) DYNAMIC BUS INVERSION METHOD AND SYSTEM

(75) Inventors: Joseph D. Macri, Markham (CA); Stephen Morein, Markham (CA); Ming-Ju E. Lee, Markham (CA); Lin Chen, Markham (CA)

(73) Assignee: ATI Technologies, Inc., Markham, Ontario (CA)

( * ) Notice: Subject to any disclaimer, the term of this patent is extended or adjusted under 35 U.S.C. 154(b) by 972 days.

(21) Appl. No.: 11/357,291

(22) Filed: Feb. 17, 2006

(65) Prior Publication Data

US 2007/0038789 A1    Feb. 15, 2007

Related U.S. Application Data

(63) Continuation-in-part of application No. 11/195,082, filed on Aug. 1, 2005.

(51) Int. Cl.
*H04B 3/00* (2006.01)

(52) U.S. Cl. .............. 375/257; 341/55; 341/56; 365/189.02; 365/189.05; 365/189.07; 710/105; 710/305

(58) Field of Classification Search ............ 375/257; 341/55, 56; 365/189.02, 189.05, 189.07; 710/105, 305
See application file for complete search history.

(56) References Cited

U.S. PATENT DOCUMENTS 6,182,175 B1   1/2001  Nihouran

| 2002/0145586 | A1* | 10/2002 | Arai ........................ 345/100 |
| 2003/0158981 | A1  | 8/2003  | LaBerge |
| 2004/0068594 | A1* | 4/2004  | Asaro et al. .............. 710/104 |
| 2005/0132112 | A1* | 6/2005  | Pawlowski ................ 710/110 |
| 2005/0216630 | A1* | 9/2005  | Gaskins et al. ........... 710/100 |

FOREIGN PATENT DOCUMENTS

| EP | 0978788 A | 2/2000 |
| EP | 1336972 A | 8/2003 |
| WO | WO 02/39290 A | 5/2002 |

OTHER PUBLICATIONS

Form PCT/ISA/220, "PCT Notification of Transmittal of The International Search Report and the Written Opinion of the International Searching Authority, or the Declaration," 2 pgs.
Form PCT/ISA/210, "PCT International Search Report," 4 pgs.
Form PCT/ISA/237, "PCT Written Opinion of the International Searching Authority," 5 pgs.

* cited by examiner

*Primary Examiner*—David C Payne
*Assistant Examiner*—Zewdu Kassa
(74) *Attorney, Agent, or Firm*—Courtney IP Law

(57) ABSTRACT

A dynamic bus inversion (DBI) method and system are described. In various embodiments, a transmitter transmits data over a multi-bit high-speed bus to a receiver. In an embodiment, the transmitter determines whether to invert the bus based on the number of data bits that will be transitioning to a new value. If it is determined that the bus is to be inverted, the transmitter encodes a DBI signal on a shared line of the bus. In an embodiment, the shared line is used for different purposes at different times, obviating the need for a dedicated line or pin for the encoded DBI signal. The receiver receives and decodes the DBI signal and, in response, appropriately decodes the received data.

23 Claims, 7 Drawing Sheets

DYNAMIC BUS INVERSION METHOD AND SYSTEM

RELATED APPLICATION

This application is a continuation-in-part of U.S. patent application Ser. No. 11/195,082, entitled Bit-Deskewing IO Method and System, filed Aug. 1, 2005, which is incorporated by reference herein in it entirety.

TECHNICL FIELD

The invention is in the field of data transfer in computer systems and other digital systems.

BACKGROUND

As computer and other digital systems become more complex and more capable, methods and hardware to enhance the transfer of data between system components or elements continually evolve. Data to be transferred includes signals representing information, commands, or any other signals. System components or elements can include different functional hardware blocks on a single integrated circuit (IC), or on different ICs. The different ICs may or may not be on the same printed circuit board (PCB). System components typically include an input/output (I/O) interface specifically designed to receive data from other system components and to transmit data to other system components. Generally speaking, existing I/O interfaces can be categorized as either serial "links" or parallel "links". Regardless of the type of I/O interface, data transfers data must be synchronized between system components for proper operation. Synchronization includes accounting for or compensating for several phenomena that potentially cause errors, including signal jitter and signal skew. The phenomena include differences between component clocks, and physical attributes of the data paths that create noise and affect the integrity of the transferred signal.

In modem high speed interfaces such as double data rate (DDR) and graphics DDR (GDDR) interfaces, some known problematic phenomena are even more pronounced than in slower interfaces. For example, modem interfaces that transmit many bits at a time can experience degradation in data integrity due to excessive rates of current change. Data transmission typically involves multiple-bit bytes. A byte can be 8 bits or 12 bits for example. If all of the bits toggle at the same time the data bus draws a relatively large amount of current. Toggling is also referred to as changing state or changing logic level. When there is a lot of current on the bus, it affects the rate of change of current of the bus, or di/dt. When the number of bits changing state on the bus at one time increases, the rate of change of the current (di/dt) increases accordingly. When di/dt increases, the signal integrity decreases. At higher frequencies this phenomenon is exaggerated.

One way to resolve this issue is to reduce di/dt. One way to do decrease di/dt is to let one portion of the bus toggle, but let the other portion remain at the same logic level. This is referred to as a Dynamic Bus Inversion (DBI) scheme. For example, if there are 8 bits on the bus, and it is determined that 5 of the 8 bits are to be toggled, instead of toggling the 5 to be toggled, the other 3 are toggled. The 5 to be toggled are not toggled. That is, if the majority of bits are scheduled to be toggled, the bus is inverted and the minority is toggled instead. A signal is sent to the receiver indicating the bus is being inverted. The receiver then can decode the 8 bits correctly when they are received. So if the majority is scheduled to toggle, bus is inverted and the minority is toggled instead.

Minimizing power consumption is also critical for modem systems. For a terminated bus, power usage is affected by the way bits are toggled. For example, if the bus is terminated high to the power supply, when the data stays low, there will be a direct current path from power to ground, and thus power is consumed. When the data stays high, there is no current, and thus no power is consumed. Therefore, to reduce power, it is better for more data bits to stay high than low for a terminated-high bus. Similarly, for terminated-low bus, it is better for more data bits to stay low than high from a power consumption point of view. Another usage of DBI is to take advantage of this fact. For example, if there are 8 bits on a terminated-high bus, and it is determined that 5 of the 8 bits are to stay low, instead of toggling those 5 bits to be low, the other 3 bits are toggled to be low. For a terminated-low bus, of course, the high and low bits are reversed. The 5 to be toggled are not toggled. Again, a signal is sent to the receiver indicating the bus is being inverted. The receiver then can decode the 8 bits correctly when they are received. Conventionally, there are an extra bit and pin called the DBI bit and DBI pin that are used to indicate to the receiver whether or not the bus is inverted. Conventionally, one DBI pin is required for each data byte. In a 64-bit interface, 8 DBI pins are required just for the DBI function.

In addition to the signal integrity degradation caused by excessive rates of current change, there are signal integrity problems associated with signal timing issues. A typical serial link embeds clock information within the data stream and extracts the clock information at the receiver using a clock recovery scheme. Such schemes are also known as per-line closed-loop timing. Guaranteeing transition density requires encoding the data, typically using 8B/10B codes. A disadvantage of this approach is that it adds bandwidth overhead and increases complexity, which hurts performance and increases cost.

A typical parallel link sends a clock signal, or strobe, with a group of N data signals (for example, N may be 8 in a double data rate dynamic random access memory (DDR DRAM)). Depending on the data rate and the level of sophistication required, one of the following "source-synchronous timing" methods is used: the receiver simply samples the data with the strobe directly if the strobe has already been shifted by half a bit time relative to the data sent by the transmitter; or if the strobe is aligned with the edge of the data sent by the transmitter, the receiver delays the strobe by the same fixed amount across the group of data to sample the data at the nominal center of the data eye, where the data eye can be thought of as a time period during which the data signal is most stable.

Each of the two foregoing parallel link approaches require very tight matching of the trace impedance and trace length across the group of data lines and the strobe line to achieve high data rates. To alleviate this, each bit receiver can delay the strobe by a different amount to place its own clock at the center of its own data eye. This is sometimes called per-bit de-skew. A disadvantage of this parallel scheme is that the strobe (which is usually sent across a circuit board and distributed to the group of data) is noisy, thus reducing the system timing budget. In addition, the receiver simply uses or delays the strobe, which adds jitter rather than filtering jitter. In some implementations, a strobe is transmitted for each data bit rather than for a group of bits, which increases pin counts and cost.

DETAILED DESCRIPTION

Embodiments of a dynamic bus inversion DBI method and system are described herein. In one embodiment, a system component receives a forward strobe signal and multiple data bit signals from a transmitting component. The receiving component includes a forward strobe clock recovery circuit configurable to align a forward strobe sampling clock so as to improve sampling accuracy. The receiving component further includes at least one data bit clock recovery circuit configurable to align a data bit sampling clock so as to improve sampling accuracy, and to receive a signal from the forward strobe clock recovery circuit that causes the data bit sampling clock to track the forward strobe sampling clock during system operation. The forward strobe signal is used to align a sampling clock, but is not used to directly sample data. Accordingly, the forward strobe signal is not required to be continually transmitted to the receiving component. In addition, no particular pattern of bits is required to be transmitted on the forward strobe signal. As a result, the strobe line that is used to transmit the forward strobe signal is also available to transmit a DBI signal that indicates to the receiving component when the bus is inverted. This obviates the need for a dedicated DBI pin for each data byte.

Embodiments achieve data rates similar to a serial link with per-line closed-loop timing, but without the typically associated complexity and encoding bandwidth overhead.

Figure 1:
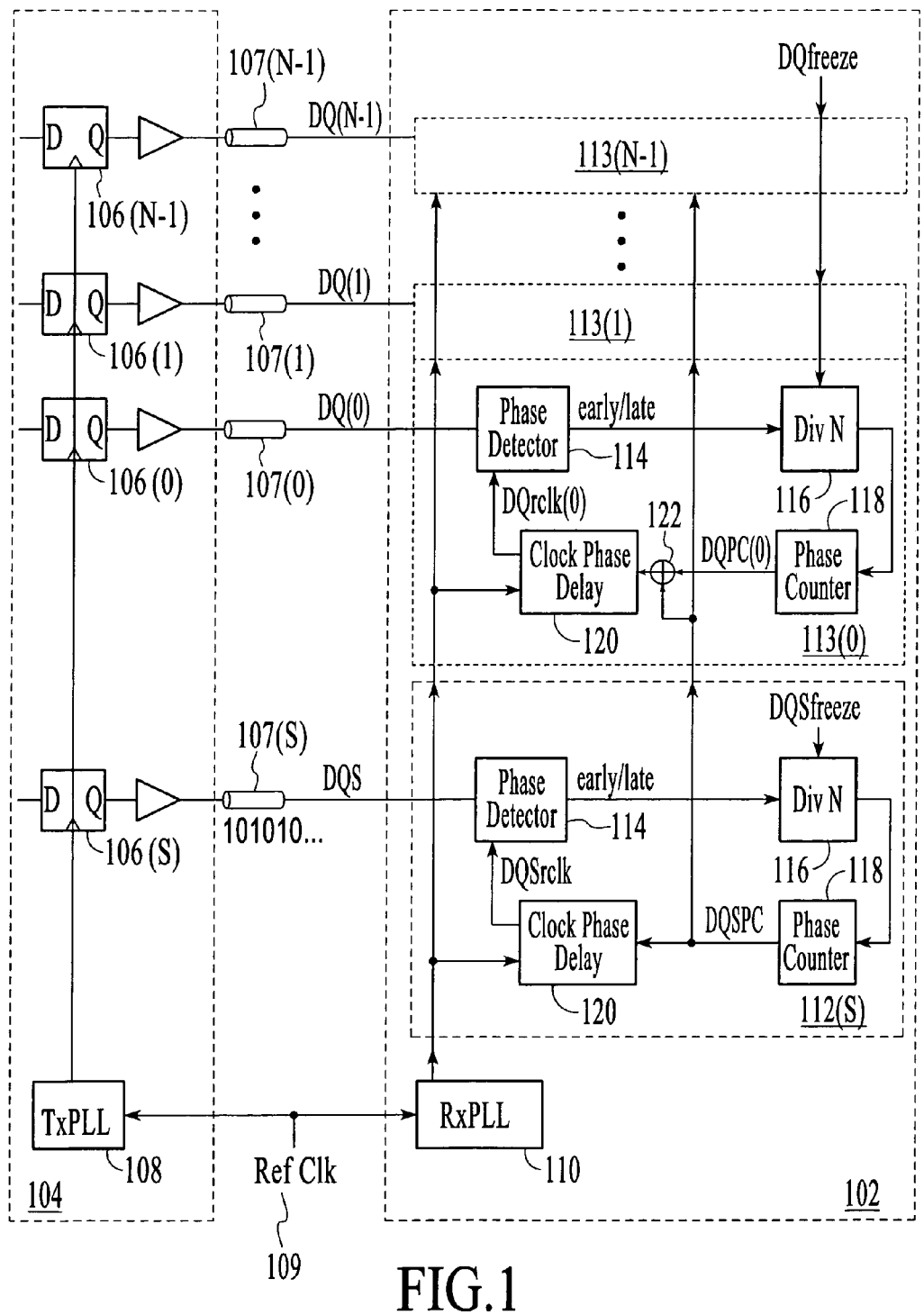
FIG. 1 is a block diagram of portions of a system including a receiver interface according to an embodiment.

FIG. 1 is a block diagram of portions of a system 100 according to an embodiment. System 100 includes a transmitter 104 and a receiver interface 102. System 100 may be any computer system or sub-system thereof, digital system, component or combination of components that transits data among components. The components may be blocks of circuitry on an integrated circuit, different integrated circuits on the same printed circuit board, or components that communicate via a network. In various embodiments, the components communicate at high speeds and high data rates. For example, system 100 may be a computer system with a graphics processing or video processing unit communicating with double data rate (DDR) DRAMs, but embodiments are not so limited.

Relevant portions of the transmitter 104 are shown, including latches or flip-flops 106(0)-106(N-1) and associated output buffers. In one embodiment, the transmitter 104 transmits a strobe signal, or forward clock (labeled DQS) that is associated with data bits DQ(0)-DQ(N-1). The data bits and the forward strobe are transmitted on transmission medium 107. Transmission medium 107 in various embodiments can be one or more of a cable, a PCB trace, or any other known transmission medium. The data bits DQ are transmitted according to the communication taking place between the transmitter 104 and a receiving component that includes the receiver interface 102. The forward strobe DQS, in contrast, is transmitted as a toggling logic value. The pattern shown (101010 . . . ) is one example of a pattern that may be transmitted for aligning clock signals as explained below, but other patterns may be used and the invention is not so limited. The transmitter 104 further includes a transmit phase lock loop (TxPLL) 108, which is a well known circuit. For example, PLLs are used as a control mechanism in most frequency synthesizers. TxPLL 108 operates in a known manner.

The receiver interface 102 includes a receive PLL (RxPLL) 110 that operates in a known manner. TxPLL 108 and RxPLL 110 both receive a reference clock signal, Ref Clk 109. The output of TxPLL 108 provides a clock signal for latches 106. The output of RxPLL 110 is input to a clock phase delay circuit 120 for each of the data bits DQ and for the forward strobe signal DQS, as described in more detail below.

The forward strobe signal DQS is received by a clock recovery circuit 112(S) of the receiver interface 102. Receiver interface 102 also includes a separate clock recovery circuit 113 for each of the data bits DQ (clock recovery circuit 113(0) for DQ(0), clock recovery circuit 113(1) for DQ(1), etc.).

In order to help ensure that received signals, including the strobe and the data signals, are correctly sampled by the receiver interface 102, the sampling clock signal is aligned so as to optimally sample the received signals. For example, in one embodiment, the sampling clock signal is aligned to sample close to the center of the received data valid window (also referred to as the data eye). This maximizes setup and hold times and reduces the probability of sampling error. The forward strobe signal and the data bits DQ are transmitted edge-aligned. One function of the clock recovery circuits 112 and 113 in the receiver interface 102 is to adjust the phase of the received RxPLL 110 output signal so that the sample point is close to the center of the data eye. In other embodiments, the phase of the received RxPLL 110 output signal may be adjusted or aligned according to other criteria in order to improve sampling accuracy appropriately to the design of the system embodiment.

Referring to clock recovery circuit 112(S), the forward strobe DQS is received by a phase detector 114. The phase detector 114 is a known circuit, such as a comparator for example, that compares the phase of the received signal to that of the sampling clock signal and determines whether it is early or late with respect to the sampling clock signal. As further explained below, the sampling clock signal is the output of the RxPLL 110 after its phase relationship to the received signal is adjusted to be aligned with the center of the forward strobe DQS through the clock phase delay circuit 120. The output of the phase detector 114 is an early/late indication for each clock cycle. The early/late indications are input to a divider 116. The divider 116 is adjustable to reduce the number of detected early/late indications by some ratio. The output of the divider 116 is an adjusted number of early/late indications that are received by a phase counter 118. The number of early/late indications is adjusted because it may not be desirable to react to every early or late indication by adjusting the phase of the RxPLL 110 output. For example, adjusting the phase of the RxPLL 110 output in reaction to each early/late indication could cause clock dither. Therefore the early/late indications are divided by a number, for example 32, such that the phase of the RxPLL 110 output is moved for every 32 indications.

The output of the phase counter 118 is a signal DQSPC which is input to a clock phase delay circuit 120 that adjusts the delay of the RxPLL 110 output to place the RxPLL 110 output at the center of DQS. In one embodiment, the clock phase delay circuit 120 is a phase interpolator, but embodiments are not so limited. The clock phase delay circuit 120 outputs a recovered forward clock signal DQSrclk that is fed back to the phase detector circuit 114. In the present embodiments, DQSrclk will be adjusted until it is at the center of the received DQS signal to maximize the setup/hold time window. In this way the DQSrclk is compared to the received DQS signal for continual adjustment while the clock recovery circuit 112(S) is enabled or active.

According to an embodiment, the clock recovery circuit 112(S) is run in an initial "training" phase to train the circuit 112(S) in the appropriate number of delays required to center the recovered forward clock signal DQSrclk on the data eye of DQS (the received strobe signal). This number of delays is represented by the DQSPC signal. Once the clock recovery circuit 112(S) has been trained and a DQSPC signal has been obtained, the clock recovery circuit 112(S) is disabled by a DQS freeze signal input to the divider circuit 116. The DQS freeze signal has the affect of maintaining the DQSPC signal at a stable value.

The receiver interface 102 further includes data bit clock recovery circuits 113(0), 113(1), and so on, through 113(N-1) for each of the data bits DQ. In an embodiment, the data bit clock recovery circuits 113 are disabled during the training phase of the clock recovery circuit 112(S) by a common DQfreeze signal. After the clock recovery circuit 112(S) is trained and disabled, the clock recovery circuits 113 are enabled for a data clock recovery circuit training phase. In the data clock recovery circuit training phase, each of the data clock recovery circuits 113 operates to detect any phase difference between the output of the RxPLL 110 and the data eye of the respective received data signal. In one embodiment, the phase adjustment established during the training phase of the strobe clock recovery circuit 112(S), as represented by the DQSPC signal, is added to a phase adjustment determined by each clock recovery circuit 113.

With reference to the clock recovery circuit 133(0), the data signal DQ(0) is received by a phase detector circuit 114. As explained with reference to the clock recovery circuit 112(S), the output of the phase detector circuit 114 is received by an adjustable divider circuit 116. The output of the divider circuit 116 is received by a phase counter 118, which outputs a signal DQPC(0) to an adder 122. The adder 122 also receives the DQSPC signal from the strobe clock recovery circuit 112(S), and adds the received signals to generate an input to a phase delay circuit 120. The DQPC signal is an intermediate clock offset that is added to the DQSPC clock offset to generate the data clock offset signal that is input to the clock phase delay circuit 120. The input from the adder 122 to the clock phase delay circuit 120 indicates an amount by which the RxPLL 110 output should be delayed. The output of the clock phase delay circuit 120 is a recovered clock signal for data bit DQ(0), or DQrclk(0).

Each of the data clock recovery circuits 113 goes through a similar training phase to arrive at a DQPC signal and a DQrclk signal. The training phases for the different clock recovery circuits 113 can occur simultaneously or at different times. When all of the data clock recovery circuits 113 are trained, they are all disabled with the DQfreeze signal. Disabling the data clock recovery circuits 113 prevents the DQPC signals of respective circuits 113 from changing.

During normal system operation, the strobe clock recovery circuit 112(S) is enabled once again and runs freely while the component containing the receiver interface 102 is operational. Thus, the circuit 112(S) will adjust DQSPC as required to keep the DQSrclk in the center of the received forward strobe (DQS). The data clock recovery circuits, on the other hand, remain disabled during normal system operation. Because each of the data clock recovery circuits receive DQSPC, however, the phase adjustment or offset of the signal that clocks each of the data bits (DQ(0) through DQ(N-1)) will be adjusted to track any DQSPC change. The data thus "tracks" the forward strobe. That is, the data and the forward strobe move together because their respective sampling clocks move together. This is effective because the relationship of each data signal to the forward strobe (or the relationship between the respective sampling clocks of each data signal and the forward strobe) was established during the training phases and should not vary greatly, given that they each should see similar environment changes.

Figure 2:
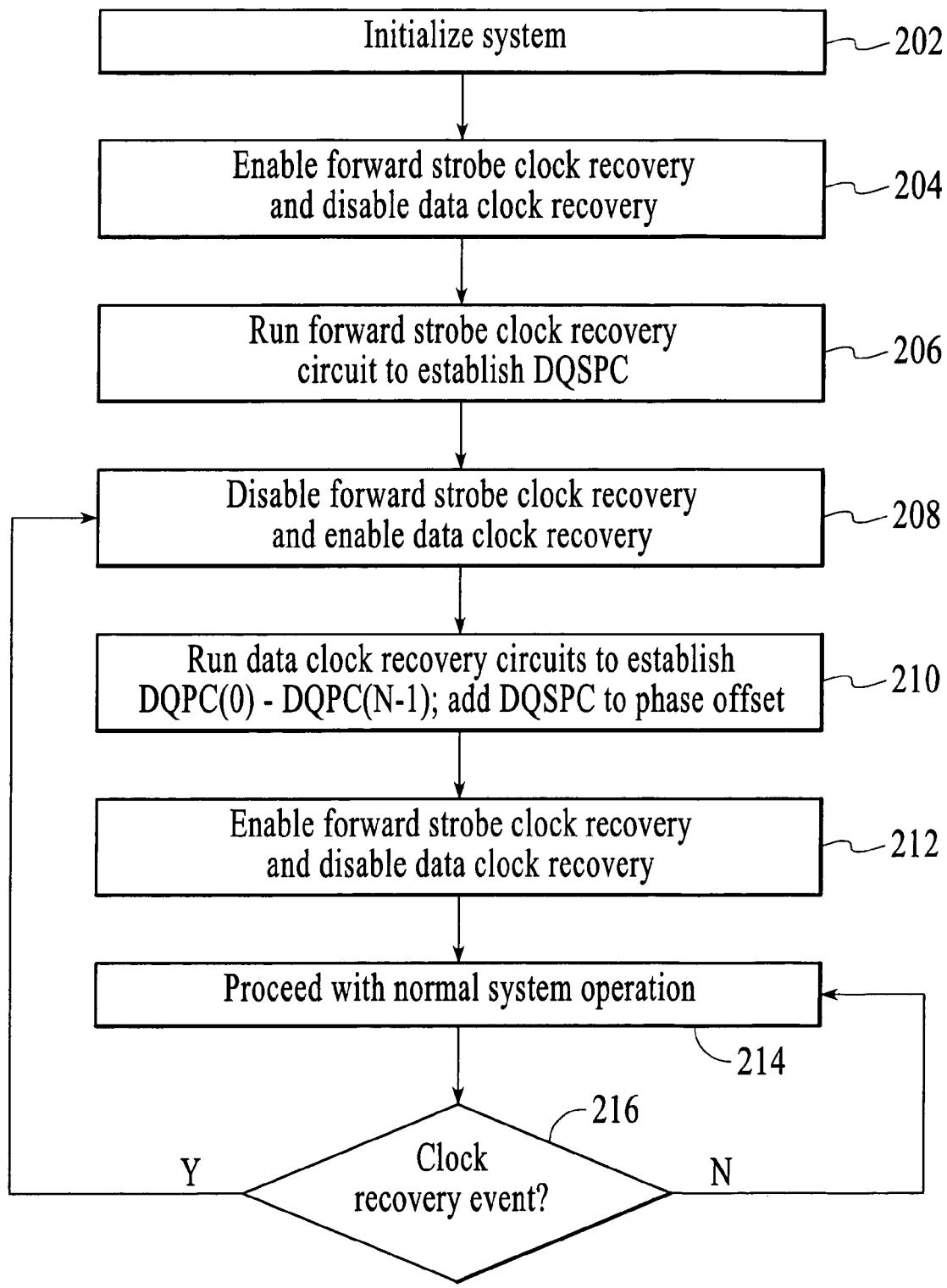
FIG. 2 is a more flow diagram of a method performed by circuitry of FIG. 1 according to an embodiment.

FIG. 2 is a flow diagram illustrating a bit-deskewing method 200 that can be performed by the system of FIG. 1 according to an embodiment. The system initializes at 202. As part of the initialization process, the forward strobe clock recovery circuit is enabled and the data clock recovery circuit is disabled as shown at 204. At 206, the forward strobe clock recovery circuit is allowed to run in order to establish DQSPC. As previously described, the DQSPC is established when the value of DQSPC is appropriate to cause a clock phase delay circuit to place the forward strobe sampling clock DQSrclk in the center of the received forward strobe data eye. In one embodiment, the forward strobe sampling clock DQSrclk is the delayed output of a transmit PLL, RxPLL, that receives a reference clock. In one embodiment, the forward strobe clock recovery circuit is run for a predetermined amount of time (for example, one millisecond) that has been determined to be sufficient to establish DQSPC. In other embodiments additional circuitry (not shown) determines when DQSPC is established.

When DQSPC has been established, the forward strobe clock recovery circuit is disabled and the data clock recovery circuits are enabled, as shown at 208. The data clock recovery circuits are run to establish respective DQPCs at 210. As previously described with reference to FIG. 1, DQSPC is added to each DQPC phase counter output during this data clock recovery training phase.

When the DQPCs have been established, the forward strobe clock recovery circuit is enabled again and the data clock recovery circuits are disabled, as shown at 212. Normal system operation then proceeds at 214.

In various embodiments, clock recovery events during normal operation may cause one or more of the clock recovery circuits to complete another training phase during system operation. For example, in one embodiment, if one or more of the DQPC values have not changed for a predetermined number of clock cycles (for example one thousand cycles), the training processes starting at 208 are repeated. In another embodiment, the system components that contain the receiver interface 102 experience idle periods or power saving periods during which no "useful" work is done by the component. Idle periods are also clock recovery events in such embodiments. An example of such a component is a double data rate dynamic random access memory (DDR DRAM) for which a refresh cycle may be used as a clock recovery event.

In various embodiments, the control of the described circuitry is performed by a high-level system protocol. Some of the behavior of the circuitry can be specified for a particular component such that a user of the component can tailor the behavior of the circuitry through the protocol. Examples of specified behavior are values for the divider circuit, predetermined amounts of time for performing clock recovery circuit training, and which events, if any, are clock recovery events.

As described above, the forward strobe signal does not need to be transmitted continually, but rather just enough to allow the clock to be recovered. The strobe pattern does not required to be 101010, etc., but can be any pattern that includes some transitions. Accordingly, the strobe line and pin are available when clock recovery is not being performed. Embodiments for dynamic bus inversion (DBI) using the strobe line will now be described with reference to FIGS. 3-7. Hereafter, the strobe line and pin are further referred to as a shared or multi-purpose line and pin. The term "shared" in this context implies that the same line is shared between different functions, or used to convey different information at different times.

Figure 3:
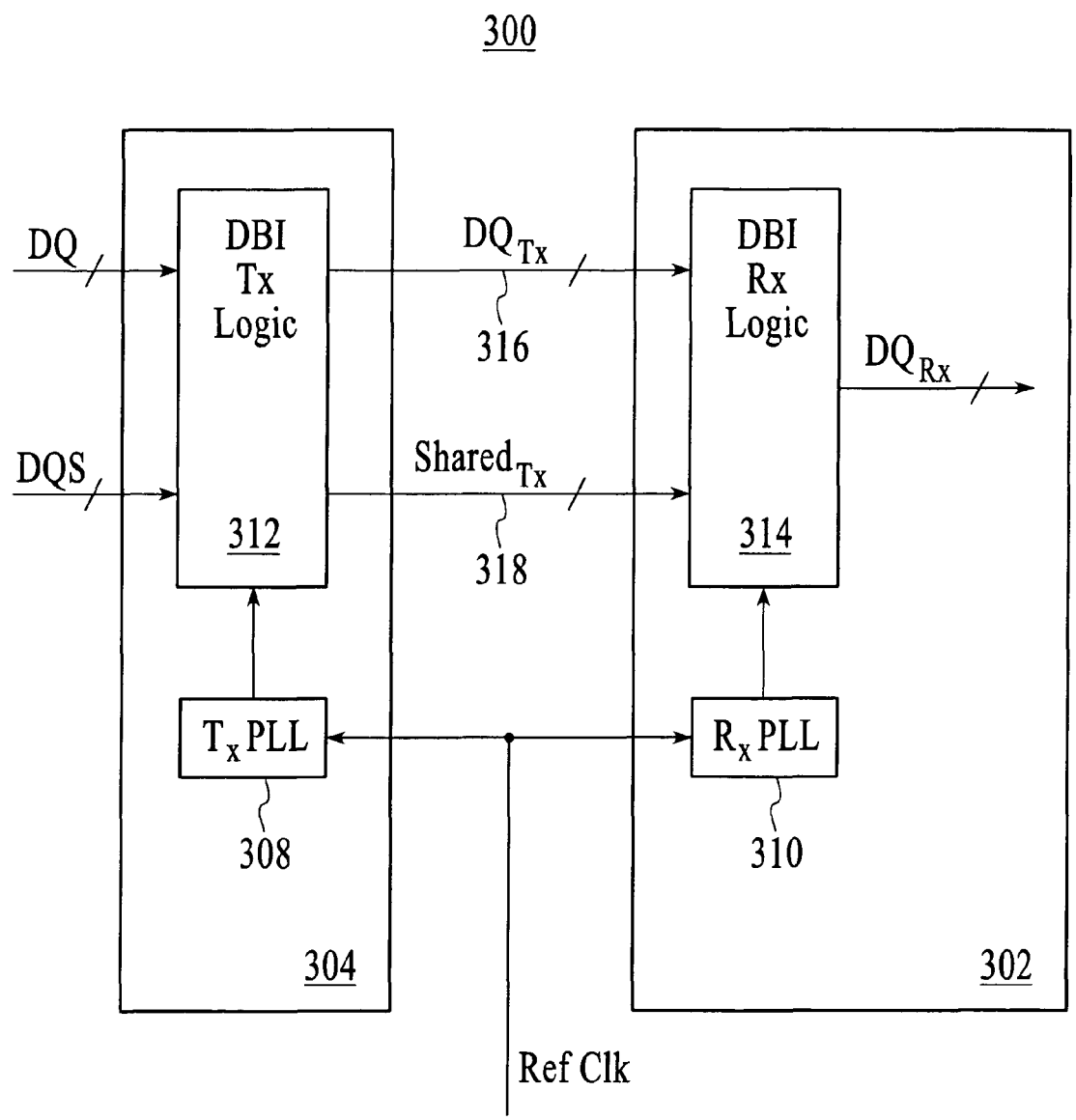
FIG. 3 is a block diagram of a system including dynamic bus inversion according to an embodiment.

FIG. 3 is a block diagram of particular components of a system 300, including components involved with a DBI method as further described below. System 300 includes a transmitter 304 and a receiver interface 302. The transmitter 304 includes DBI transmit logic 312 and transmit PLL 308. The transmit PLL 308 performs a function similar to the function performed by the transmit PLL 108 of FIG. 1. The DBI transmit logic 312 receives data bits DQ, which in this example make up a data byte. The DBI transmit logic 312 also receives a strobe signal DQS associated with the data byte DQ. In various embodiments, the components of the system shown are duplicated such that an entire interface includes 8 or more data bytes. Only one byte is shown for purposes of the description.

As further described below, the DBI transmit logic 312 determines when the data bus should be inverted. The DBI logic 304 outputs transmitted data bits $DQ_{Tx}$ on a data bus 316 to the receiver interface 302. The DBI logic 304 also outputs a signal on a shared line 318 (which may be a single shared line or multiple shared lines) that is associated with the data bits $DQ_{Tx}$. As further explained below, in some instances the signal on the shared line 318 is the forward strobe, and when the bus is inverted, the signal is an encoded DBI signal.

The receiver interface 302 includes a receive PLL 310 that performs a function similar to the receive PLL 110 of FIG. 1. The receiver interface 301 further includes DBI receive logic 314. The DBI receive logic 304 receives the data bits DQ and also receives the signal on the shared line 318.

Figure 4:
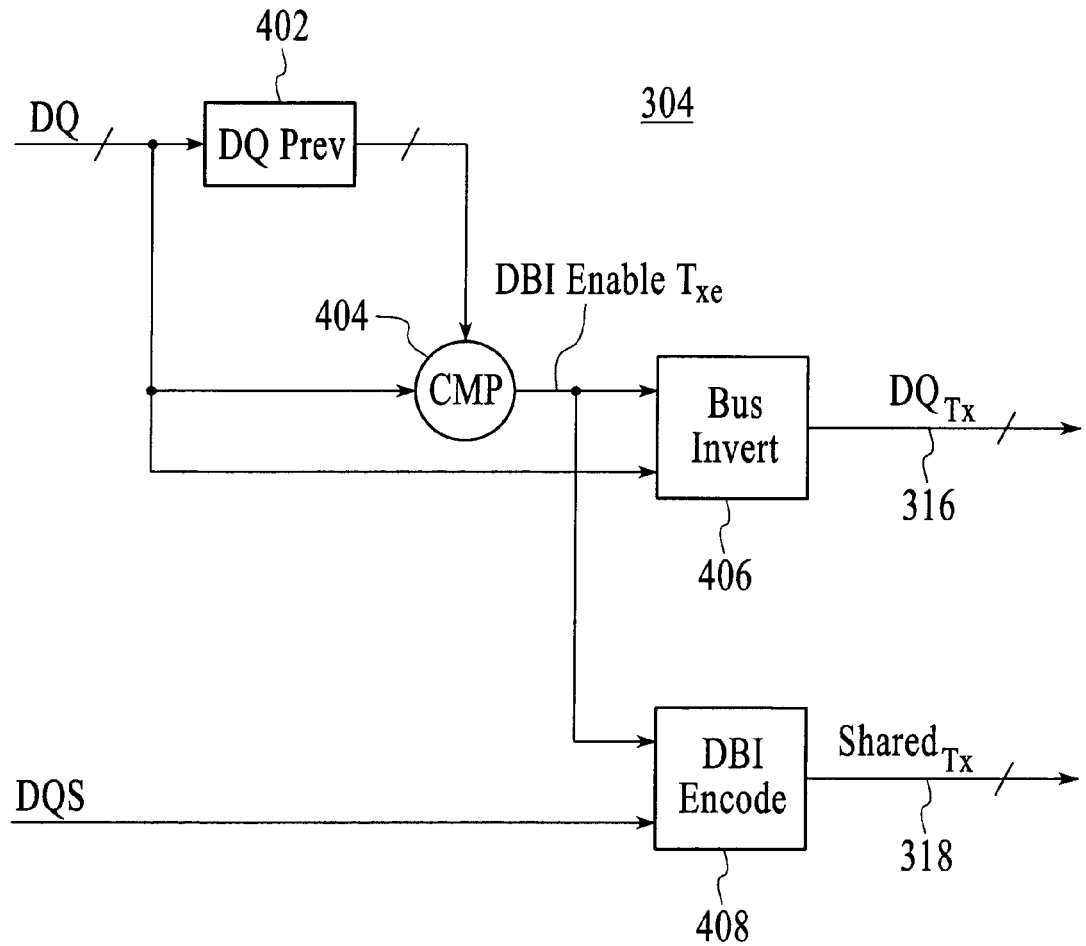
FIG. 4 is a block diagram of components of a transmitter including dynamic bus inversion according to an embodiment.

FIG. 4 is a block diagram of the DBI transmit logic 304 according to an embodiment. The received data bits DQ are stored in a storage device 402. The received data bits DQ are also received by compare logic 404. The compare logic 404 either compares the currently received data bits DQ with the previously stored data bits $DQ_{Prev}$ from the storage device 402 or calculates the majority of the data bits which toggle high or low. In an embodiment, the compare logic determines:

1) whether more than half of the data bits DQ have changed state, or toggled, as compared to their previous values $DQ_{Prev}$, and if more than half of the data bits DQ have changed state, then the compare logic 404 outputs a DBI enable transmit signal, $DBI_{Txe}$; or 2) whether the majority of the data bits will toggle low or high, and if more than half of the data bits will toggle low for a terminated-high bus or toggle high for a terminated-low bus, then the compare logic 404 outputs a DBI enable transmit signal, $DBI_{Txe}$ Bus invert logic 406 receives the $DBI_{Txe}$ signal as well as the currently received data bits DQ. When the $DBI_{Txe}$ signal is active, the bus invert logic 406 outputs the currently received data bits DQ in their received logic states as transmitted data bits on the data bus 316. When the $DBI_{Txe}$ signal is not active, the bus invert logic 406 outputs inverted, or toggled received data bits as transmitted data bits on the data bus 316.

DBI encode logic 408 receives the $DBI_{Txe}$ enable signal, and also receives the DQS signal. When the $DBI_{Txe}$ signal is active, the DBI encode logic 408 encodes the signal on the shared line 318 with a code that indicates the bus is inverted. This encoded signal is output as a DBI enable signal on the shared line 318. When the $DBI_{Txe}$ signal is not active, the DBI encode logic 408 output the received strobe signal DQS on the shared line 318.

Figure 5:
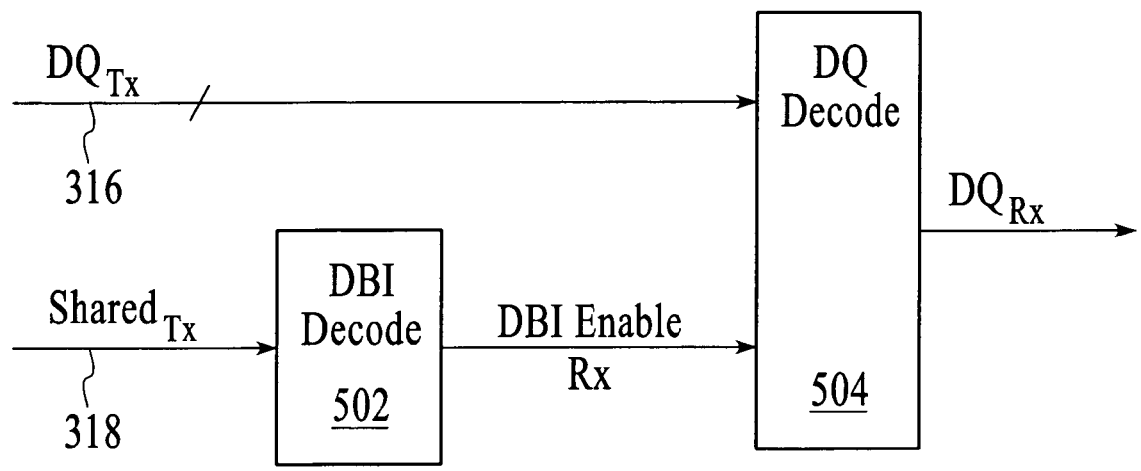
FIG. 5 is a block diagram of components of a receiver including dynamic bus inversion according to an embodiment.

FIG. 5 is a block diagram of the DBI receive logic 302 according to an embodiment. DBI decode logic 502 receives the signal transmitted on the shared line 318 and determines whether the DBI enable signal is encoded in the signal. In one embodiment, the DBI decode logic compares the bits received on the shared line 318 with a stored pattern that is predetermined to represent the DBI enable signal. When the DBI enable signal is detected, the DBI decode logic outputs a receiver DBI enable signal, $DBI_{ERx}$ to DQ decode logic 504. The DQ decode logic 504 receives $DBI_{ERx}$ signal and also receives the data bits on the data bus 316. When the $DBI_{ERx}$ signal is active, the DQ decode logic properly interprets the received data bits as being inverted, and outputs decoded, received data bits $DQ_{Rx}$. When the $DBI_{ERx}$ signal is not active, the DQ decode logic properly interprets the received data bits as having the logic states of the received data bits, and outputs decoded, received data bits $DQ_{Rx}$.

Figure 6:
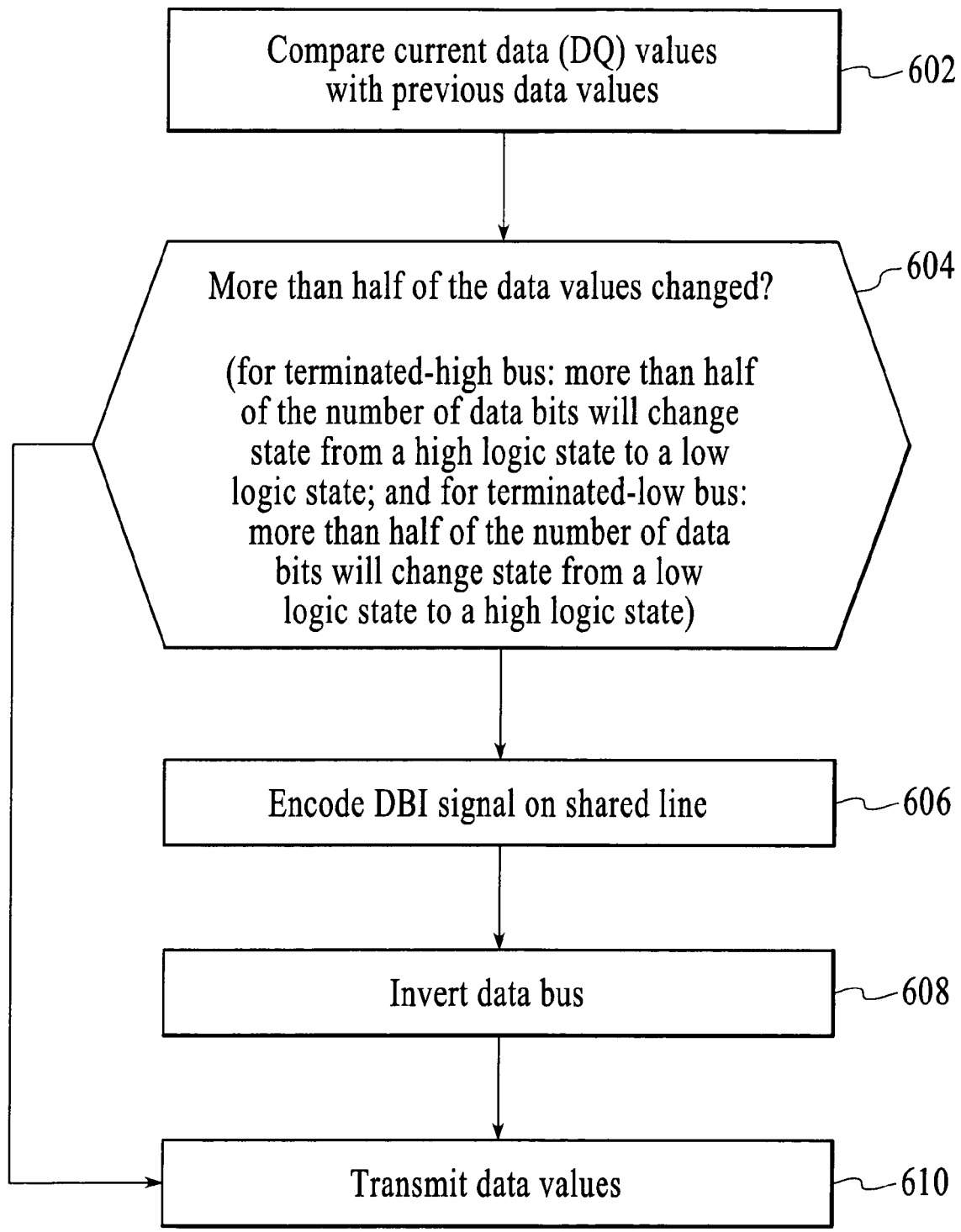
FIG. 6 is a flow diagram of a method performed by circuitry of FIG. 4 according to an embodiment.

FIG. 6 is a flow diagram of a method 600 performed by circuitry of FIG. 4 according to an embodiment. At 602 current data values are compared to previous data values. When more than half of the data values change (more than half of the data values toggle low for terminated-high bus or more than half of the data values toggle high for terminated-low bus), as determined at 604, the DBI signal is encoded on the shared line as shown at 606. The bus is also inverted, at 608. The data values are transmitted on the data bus at 610.

When more than half of the data values do not change, (more than half of the data values do not toggle low for terminated-high bus, or more than half of the data values do not toggle high for terminated-low bus), returning to 604, the data values as received are transmitted on the data bus at 610.

Figure 7:
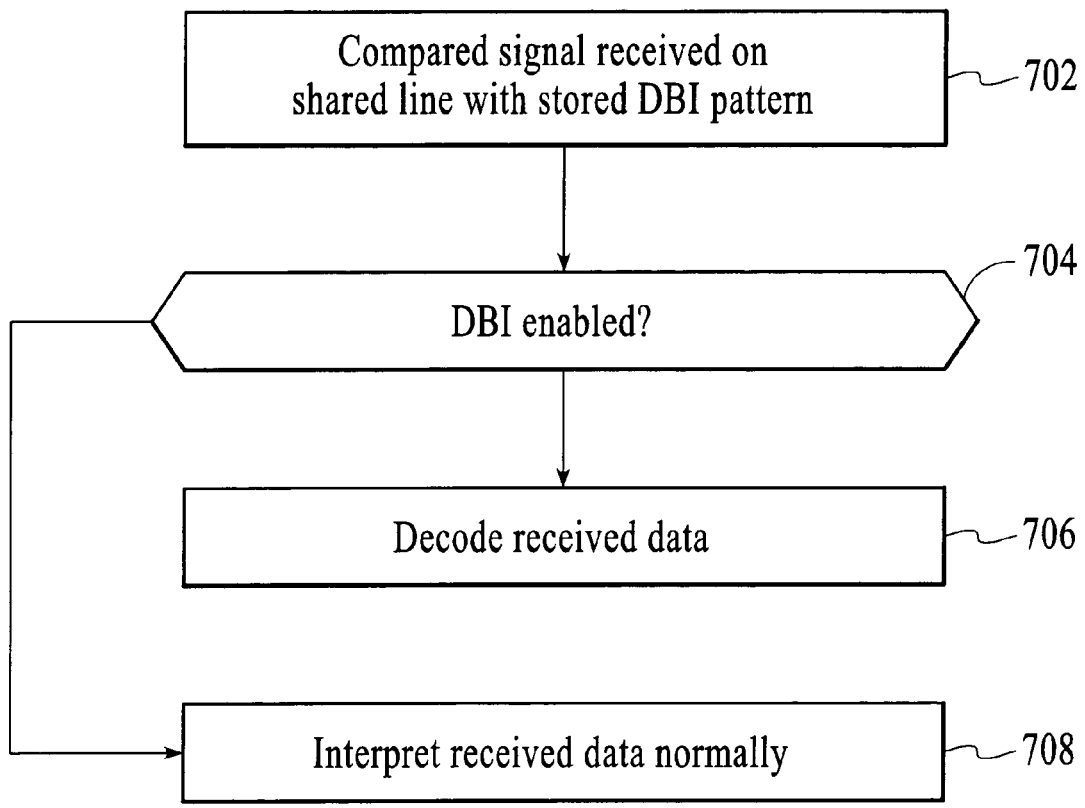
FIG. 7 is a block diagram of a method performed by circuitry of FIG. 5 according to an embodiment.

FIG. 7 is a block diagram of a method 700 performed by circuitry of FIG. 5 according to an embodiment. At 702, the signal received on the shared line is compared with a stored DBI pattern. When the DBI signal is detected on the shared line, as determined at 704, the received data is decoded at 706. That is, the data is interpreted as having been inverted. When the DBI signal is not detected at 704, the received data is interpreted normally at 708, where in this case "normally" means the logic level of the received signals is interpreted as the intended logic level.

Aspects of the invention described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing aspects of the invention include: microcontrollers with memory (such as electronically erasable programmable read only memory (EEPROM)), embedded microprocessors, firmware, software, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word, any of the items in the list, all of the items in the list, and any combination of the items in the list.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other systems, not only for the system including graphics processing or video processing or DDR DRAMs as described above. The various operations described may be performed in a very wide variety of architectures and distributed differently than described. In addition, though many configurations are described herein, none are intended to be limiting or exclusive.

In other embodiments, some or all of the hardware and software capability described herein may exist in a printer, a camera, a television, a handheld device, a mobile telephone or some other device. The elements and acts of the various embodiments described above can be combined to provide further embodiments. These and other changes can be made to the invention in light of the above detailed description.

In general, in the following claims, the terms used should not be construed to limit the described method and system to the specific embodiments disclosed in the specification and the claims, but should be construed to include any processing systems that operate under the claims to provide the described functionalities. Accordingly, the method and system is not limited by the disclosure, but instead the scope of the method and system is to be determined entirely by the claims.

While certain aspects of the method and system for are presented below in certain claim forms, the inventors contemplate the various aspects of the method and system in any number of claim forms. For example, while only one aspect of the method and system may be recited as embodied in computer-readable medium, other aspects may likewise be embodied in computer-readable medium. Accordingly, the inventors reserve the right to add additional claims after filing the application to pursue such additional claim forms for other aspects of the method and system described.

What is claimed is:

1. A method comprising:
    determining whether to invert a data bus, including considering whether less power will be used if the data bus is inverted, a percentage of data bits that will change state as compared to respective previous values, and whether a majority of data bits will toggle high-to-low or low-to-high depending on a type of data bus;
    based on a determination to invert the data bus, encoding a dynamic bus inversion (DBI) signal on a shared line of the data bus, wherein the shared line comprises a strobe line that is also used to transmit a forward strobe signal;
    receiving the DBI signal on the shared line;
    decoding the DBI signal to determine whether the data bus is inverted; and
    interpreting received data based on whether the data bus is inverted.

2. The method of claim 1, wherein determining whether to invert the data bus comprises determining to invert the bus if more than half of a number of data bits will change state.

3. The method of claim 1, wherein the data bus comprises a terminated-high bus, and wherein determining whether to invert the bus comprises determining whether more than half of the number of data bits will change state from a high logic state to a low logic state.

4. The method of claim 1, wherein the data bus comprises a terminated-low bus, and wherein determining whether to invert the bus comprises determining whether more than half of the number of data bits will change state from a low logic state to a high logic state.

5. The method of claim 1, wherein the shared line is a strobe line that is also used to transmit a strobe signal.

6. The method of claim 2, wherein determining whether to invert the bus includes comparing previous data bits transmitted on the data bus to current data bits that are to be transmitted on same lines of the data bus.

7. The method of claim 2, wherein inverting the bus comprises inverting the logic sense of the bus such that bits that were to change state do not change state and bits that were not to change state do change state.

8. The method of claim 1, wherein decoding the DBI signal comprises comparing the DBI signal received on the shared line with a stored DBI pattern.

9. A system comprising:
    a high speed interface coupled to a transmitter and a receiver, wherein the interface comprises a data bus and a shared line that is used for multiple purposes;
    a transmitter comprising dynamic bus inversion (DBI) transmit logic configurable to determine when to invert the data bus, and further configured to transmit a DBI signal on the shared line when the data bus is to be inverted, s, wherein the shared line comprises a strobe line that is also used to transmit a forward strobe signal, and wherein determining comprises determining a percentage of data bits that will change state as compared to respective previous values, and whether a majority of data bits will toggle high-to-low or low-to-high depending on a type of data bus; and
    a receiver comprising DBI receive logic configurable to decode the DBI signal.

10. The system of claim 9, wherein the receiver is configurable to determine how to interpret received data based on decoding the DBI signal.

11. The system of claim 9, wherein the shared line comprises a strobe line that is also used to transmit a strobe signal.

12. The system of claim 9, further comprising a double data rate (DDR) data bus comprising multiple sets of data lines, and an associated strobe line for each set.

13. The system of claim 12, wherein a set of data lines comprises eight data lines.

14. The system of claim 9, wherein the DBI transmit logic comprises:
  compare logic configurable to compare logic values of current data bits transmitted on the data bus to logic values of current data bits to be transmitted on the data bus, wherein the compare logic generates a DBI transmit enable signal if more than half of the current data bits have different logic levels than corresponding previous data bits;
  bus invert logic coupled to the compare logic and configurable to invert the data bus in response to the DBI transmit enable signal; and
  DBI signal encode logic coupled to the compare logic and configurable to encode a DBI signal on the shared line in response to the DBI transmit enable signal.

15. The system of claim 14, wherein the shared line is a strobe line and the DBI signal is encoded on the strobe line when the strobe signal is not being transmitted.

16. The system of claim 9, wherein the DBI receive logic comprises DBI signal decode logic configurable to receive the encoded DBI signal from the transmitter and to determine whether the data bus is inverted.

17. The system of claim 16, wherein the DBI signal decode logic is further configurable to output a DBI receive enable signal that enables the receiver to interpret data signals on the inverted data bus.

18. A transmitter, comprising:
  compare logic configurable to compare logic values of previous data bits transmitted on the data bus to logic values of current data bits to be transmitted on the data bus, wherein the compare logic generates a DBI transmit enable signal if more than half of the current data bits have different logic levels than corresponding previous data bits, wherein the previous data bits and the current data bits are transmitted on a group of data lines, and the group of data lines is associated with a line that is used to transmit various information at various times;
  bus invert logic coupled to the compare logic and configurable to invert the data bus in response to the DBI transmit enable signal; and
  DBI signal encode logic coupled to the compare logic and configurable to encode a DBI signal on the shared line in response to the DBI transmit enable signals, wherein the shared line comprises a strobe line that is also used to transmit a forward strobe signal.

19. The transmitter system of claim 18, wherein the shared line is a strobe line and the DBI signal is encoded on the strobe line when a strobe signal is not being transmitted.

20. The transmitter of claim 18, wherein the bus invert logic inverts the bus when more than half of a group of data lines will change state from a state that was previously transmitted.

21. A receiver, comprising:
  dynamic bus inversion (DBI) signal decode logic configurable to receive the encoded DBI signal from the transmitter and to determine whether the data bus is inverted, wherein the DBI signal is transmitted on a line of a high speed bus that is used for different signals at different times, wherein the line comprises a strobe line that is also used to transmit a forward strobe signal; and data decode logic that interprets data received based on whether the bus is inverted or not, wherein the line of the high speed bus is a strobe line that is also used to transmit a strobe signal to the receiver, wherein the strobe signal is associated with a group of data lines, wherein the DBI signal is associated with the group of data lines.

22. The receiver of claim 21, wherein the line of the high speed bus is a strobe line that is also used to transmit a strobe signal to the receiver, wherein the strobe signal is associated with a group of data lines.

23. The receiver of claim 22, wherein the DBI signal is associated with the group of data lines.

* * * * *